(12) United States Patent
Jing et al.

(10) Patent No.: US 8,507,369 B2
(45) Date of Patent: Aug. 13, 2013

(54) METHOD FOR PRODUCING SILICON NANOWIRE DEVICES

(71) Applicants: Xubin Jing, Shanghai (CN); Bin Yang, Shanghai (CN); Mingsheng Guo, Shanghai (CN)

(72) Inventors: Xubin Jing, Shanghai (CN); Bin Yang, Shanghai (CN); Mingsheng Guo, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/659,907

(22) Filed: Oct. 24, 2012

(65) Prior Publication Data
US 2013/0102134 A1    Apr. 25, 2013

(30) Foreign Application Priority Data
Oct. 25, 2011 (CN) .......................... 2011 1 0328162

(51) Int. Cl.
*H01L 21/00* (2006.01)
(52) U.S. Cl.
USPC ........................................ 438/491; 977/762

(58) Field of Classification Search
USPC .......................... 438/478, 488, 491; 977/762
See application file for complete search history.

(56) References Cited

U.S. PATENT DOCUMENTS

2006/0284118 A1* 12/2006 Asmussen et al. ........ 250/492.21
2008/0149992 A1*  6/2008 Gidon ........................... 257/316

* cited by examiner

*Primary Examiner* — Bradley K Smith
(74) *Attorney, Agent, or Firm* — Anova Law Group, PLLC

(57) ABSTRACT

The invention provides a method for producing silicon nanowire devices, including the following steps: growing SiNW on a substrate; depositing an amorphous carbon layer and dielectric anti-reflectivity coating orderly; removing part of dielectric anti-reflectivity coating and amorphous carbon layer above the SiNW through dry etching to expose the SiNW device area; depositing an oxide film on the surface of the above structure; forming a metal pad connected with the SiNW in the SiNW device area; depositing a passivation layer on the surface of the above structure; applying photolithography and etching technology to form contact holes on the metal pad and to remove the passivation layer, the oxide film and the dielectric anti-reflectivity coating above the SiNW outside the device area, stopping on the amorphous carbon layer; removing the amorphous carbon layer above the SiNW outside the device area through ashing process to expose the SiNW.

9 Claims, 6 Drawing Sheets

METHOD FOR PRODUCING SILICON NANOWIRE DEVICES

CROSS-REFERENCE TO RELATED APPLICATION

This application claims the priority benefit of China application serial no. 201110328162.4, filed Oct. 25, 2011. All disclosure of the China application is incorporated herein by reference.

FIELD OF THE INVENTION

The present invention relates to a biochip, and more particularly to a method for producing silicon nanowire devices.

BACKGROUND OF THE INVENTION

In recent years, with the continuing investigation and research in the field of nanotechnology, materials with one-dimensional nanostructures, such as silicon nanowire (SiNW), have attracted more and more attention. SiNW has advantages of significant quantum effect and large surface to volume ratio, which brings a bright prospect for applications in the fields of MOS devices, sensors, and so on.

As an elementary cell of the biochip, SiNW devices have been widely used for bio-detection and diagnostics. Referring to FIG. 1a and FIG. 1b, the conventional method of producing SiNW devices includes covering an oxide layer 2022 on the surface 2021 of the polycrystalline/monocrystalline silicon to form the SiNW 202 as well as the SiNW device area B on both sides of the SiNW 202. The principle of the SiNW devices produced in such way is similar to the principle of the MOS-FET. The oxide layer on the polycrystalline/monocrystalline silicon is utilized as gate oxide, by which the bio-molecule groups with electric charges are absorbed. These charges can adjust the potential of the SiNW in a similar way to adjust the potential of the MOSFET, and then the conductivity properties of SiNW can be affected. Therefore, the specified bio-molecule groups can be identified by monitoring the conductivity properties of the SiNW.

FIG. 2 is a schemic diagram of the basic structure of a conventional SiNW device in prior art. The extremely narrow polysilicon wires covered with oxide films of evenly thickness are exposed to the external environment, and the SiNW device area B is covered with an insulating layer. In the conventional semiconductor technology, photolithography and etching technology are usually applied to achieve the above basic structure. However, due to the anisotropic etching properties, the mini spacers 211 may be formed on the SiNW outside the device area B. Furthermore, plasma etching may result in the damage of the SiNW.

SUMMARY OF THE INVENTION

Accordingly, at least one objective of the present invention is to provide a method for producing silicon nanowire devices to avoid the forming of the mini spacer of the SiNW outside the SiNW device areas and to reduce the cost.

To achieve these and other advantages and in accordance with the objective of the invention, as embodied and broadly described herein, the invention provides a method for producing silicon nanowire devices including the following steps:

Growing SiNW on a substrate;

Depositing an amorphous carbon layer to cover the SiNW, followed by depositing a dielectric anti-reflectivity coating on the amorphous carbon layer;

Removing part of the dielectric anti-reflectivity coating and the amorphous carbon layer above the SiNW through dry etching to expose the SiNW device area;

Depositing an oxide film on the surface of the above structure;

Forming a metal pad connected with the SiNW in the SiNW device area

Depositing a passivation layer on the surface of the above structure;

Applying photolithography and etching technology to form contact holes on the metal pad, and to remove the passivation layer, the oxide film and the dielectric anti-reflectivity coating above the SiNW outside the SiNW device area, and stopping on the amorphous carbon layer;

Removing the amorphous carbon layer above the SiNW outside the SiNW device area through ashing process to expose the SiNW.

Preferably, the step of growing SiNW on the substrate includes:

Using thermal oxidation technology to form a silicon dioxide layer on the substrate, followed by the depositing a polysilicon layer on the silicon dioxide layer and applying low-concentration doping to the polysilicon layer;

Applying photolithography and etching technology to the polysilicon layer to form polysilicon wires;

Using thermal oxidation technology to grow an oxide layer on the surface of the polysilicon wires to form the SiNW.

Preferably, the step of removing part of the dielectric anti-reflectivity coating and the amorphous carbon layer above the SiNW through dry etching to expose the SiNW device area includes the following detailed steps:

Coating photoresist on the dielectric anti-reflectivity coating and defining the etching window corresponding to the SiNW device area through photolithography; removing the dielectric anti-reflectivity coating and the amorphous carbon layer by dry etching through the etching window to expose the SiNW device area; and removing the photoresist.

Preferably, the step of forming the metal pad connected with the SiNW in the SiNW device area includes the following detailed steps: using photolithography and etching technology to form through-holes throughout the oxide film and connected with the top of the polysilicon wires; depositing metals in the through-holes and on the surface of the oxide film to form a metal layer; and applying photolithography and etching technology to the metal layer on the surface of the oxide film to form the metal pad.

Preferably, the step of utilizing photolithograph and etching technology to form contact holes on the metal pad and to remove the passivation layer, the oxide film and the dielectric anti-reflectivity coating above the SiNW outside the SiNW device area, and stopping on the amorphous carbon layer includes the following steps: coating photoresist on the passivation layer and forming a first etching window and a second etching window through photolithography; etching the passivation layer within the first etching window and stopping on the metal pad to form the contact holes; etching the passivation layer, the oxide film and the dielectric anti-reflectivity coating within the second etching window, and stopping on the amorphous carbon layer.

Preferably, the step of removing the amorphous carbon layer above the SiNW outside the SiNW device area through ashing process to expose the SiNW includes removing the photoresist in the SiNW device area.

Preferably, the dielectric anti-reflectivity coating has a thickness of about 200 Å-600 Å.

Preferably, the metal pad is an aluminum pad.

Preferably, the passivation layer is made from silicon nitride and silicon dioxide.

Compared with the conventional method, the amorphous carbon layer is utilized for producing SiNW devices in the present invention. Since the amorphous carbon layer has both isotropic and anisotropic etching properties, a barrier layer can be formed firstly by anisotropic etching; and then after the subsequent low-temperature patterning process such as metal connections, the amorphous carbon layer can be removed by isotropic etching to expose the SiNW. Since the amorphous carbon layer has the significant advantages of high etch ratio and low plasma destructiveness, the forming of the mini spacer of the SiNW of the SiNW devices can be avoided and the manufacturing cost can be reduced as well.

BRIEF DESCRIPTION OF THE DRAWINGS

The method for producing silicon nanowire devices of the present invention will be elucidated by reference to the following embodiments and the accompanying drawings, in which:

FIG. 1b is a cross-sectional view of FIG. 1a;

DETAILED DESCRIPTION OF THE EMBODIMENTS

Figure 1A:
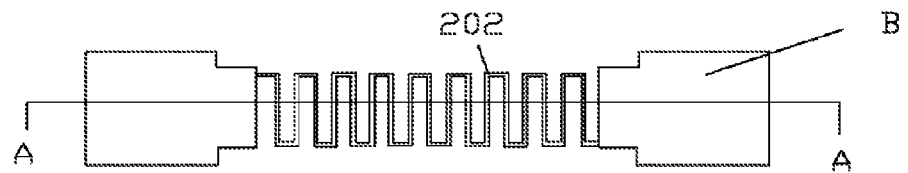
FIG. 1a is a top view of a SiNW device.
Figure 1B:
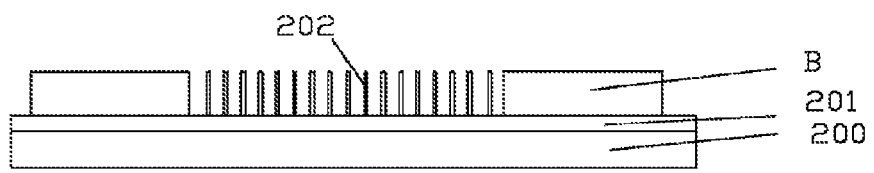
Figure 2:
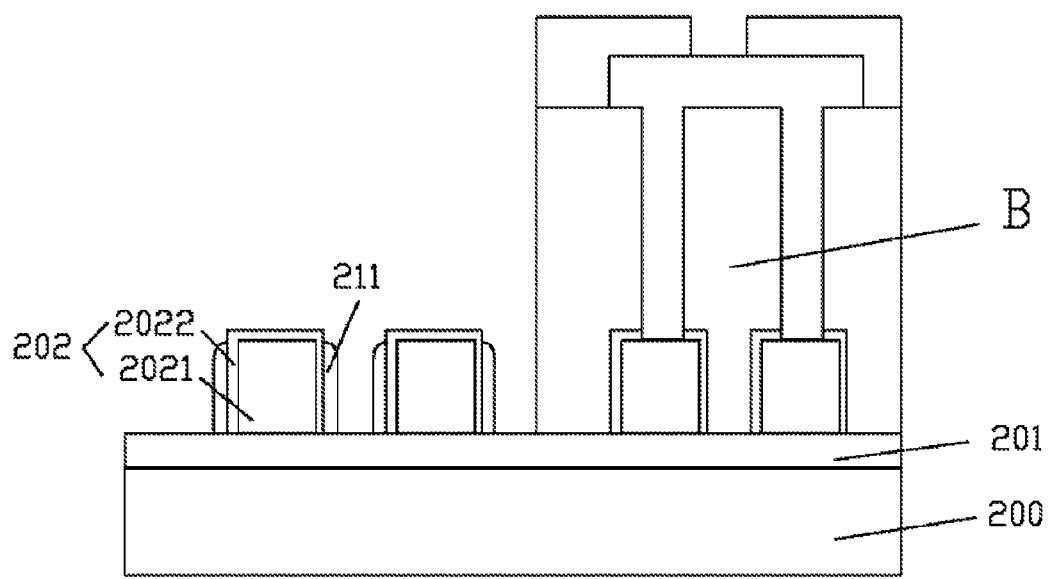
FIG. 2 is a cross-sectional view of a conventional SiNW device.

The method for producing silicon nanowire devices of the present invention will be described in further details hereinafter with respect to the embodiments and the accompanying drawings.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 3:
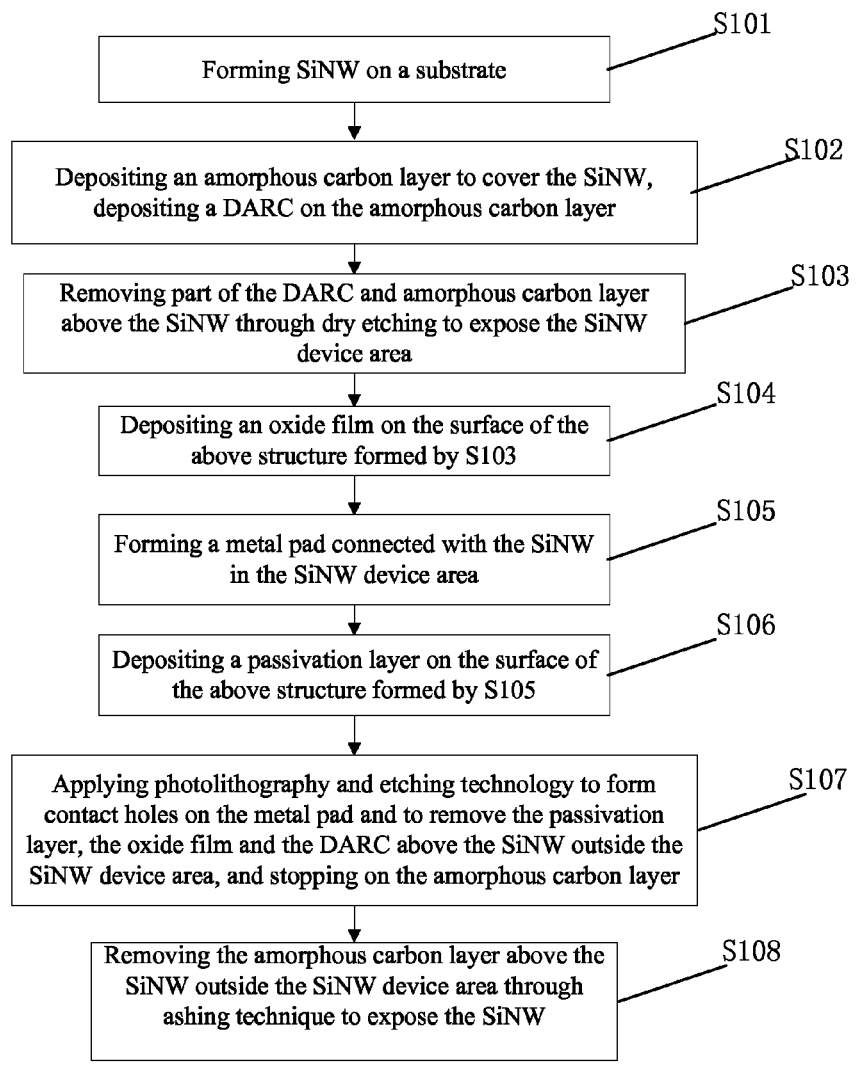
FIG. 3 is a flowchart of the manufacturing process of the SiNW device in one embodiment of the present invention.
Figure 4A:
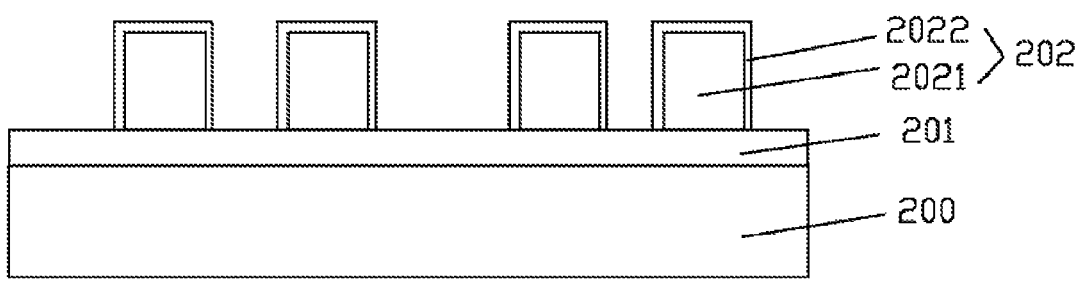
FIG. 4a-FIG. 4h is a cross-sectional view of the manufacturing process of SiNW device in the embodiment of the invention.

Referring to FIG. 3, in one embodiment of the present invention, the method for producing SiNW device comprises the following steps:

In step 101, as shown in FIG. 4a, growing SiNW on a substrate. It includes the following steps: forming a silicon dioxide layer 201 on the substrate 200 by thermal oxidation, and then depositing a polysilicon layer 2021 on the silicon dioxide layer 201, followed by applying low-concentration doping to the polysilicon layer 2021.

Applying photolithography and etching technology to the polysilicon layer to form the polysilicon wire 2021;

Growing an oxide layer 2022 on the surface of the polysilicon wire 2021 through thermal oxidation to form the silicon nanowire 202.

Figure 4B:
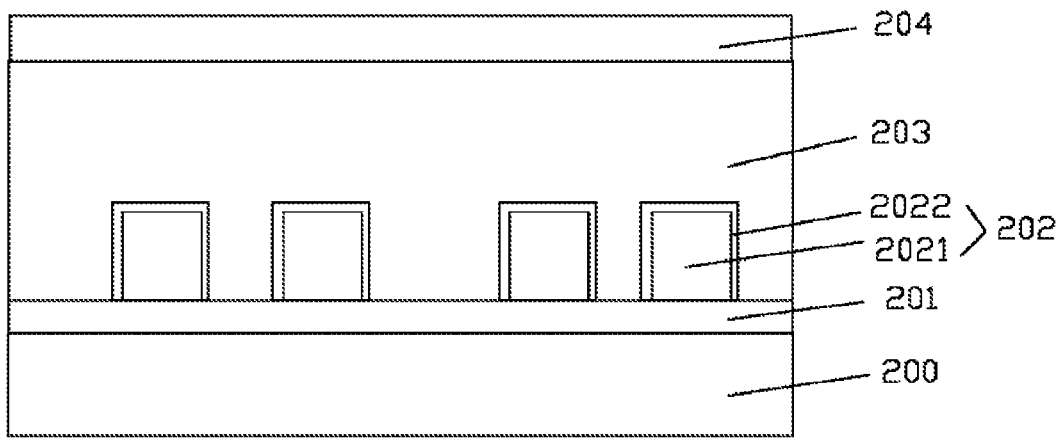

In step 102, as shown in FIG. 4b, depositing an amorphous carbon layer 203 to cover the SiNW 202 and depositing a dielectric anti-reflectivity coating (DARC) 204 above the amorphous carbon layer 203. For example, the amorphous carbon layer 203 can be the Advanced Patterning Film (APF film) of Applied Material Inc. The thickness of the DARC 204 can be about 200 Å-600 Å.

Figure 4C:
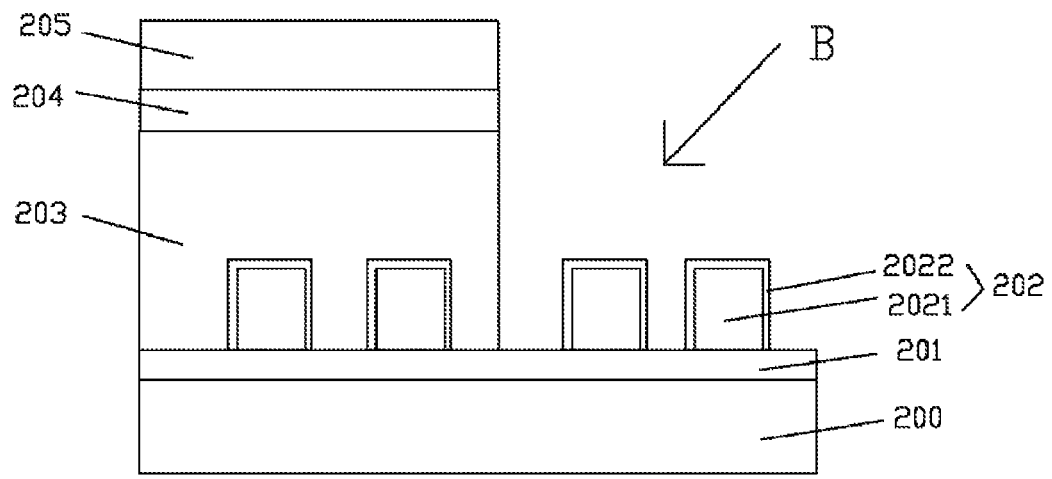

In step 103, as shown in FIG. 4c, removing part of the DARC 204 and the amorphous carbon layer 203 above the SiNW 202 by dry etching to expose the SiNW device area. The step further includes coating photoresist 205 on the DARC 204 and defining the etching windows corresponding to the SiNW device area through photolithography; removing the DARC 204 and amorphous carbon layer 203 by dry etching through the etching windows to expose the SiNW device area B; Note that, the SiNW 202 outside the SiNW device area B is still covered by the amorphous carbon layer 203, the DARC 204 and photoresist 205. Subsequently, removing the photo resist 205.

Figure 4D:
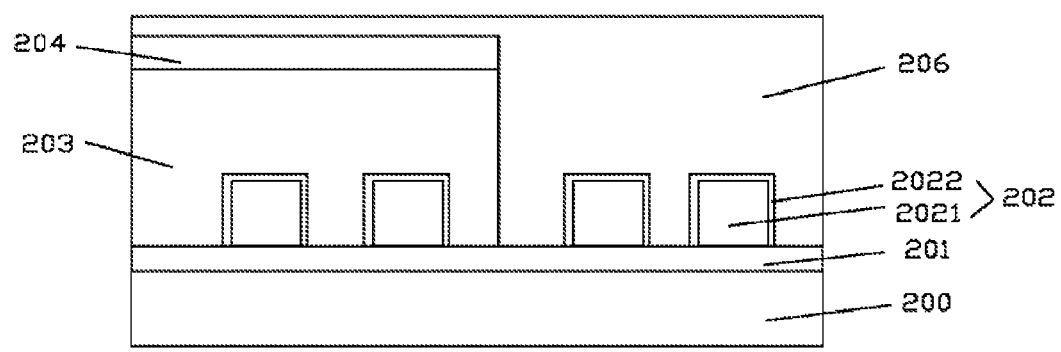

In step 104, as shown in FIG. 4d, depositing an oxide film 206 on the surface of the above structure formed by step 103.

Figure 4E:
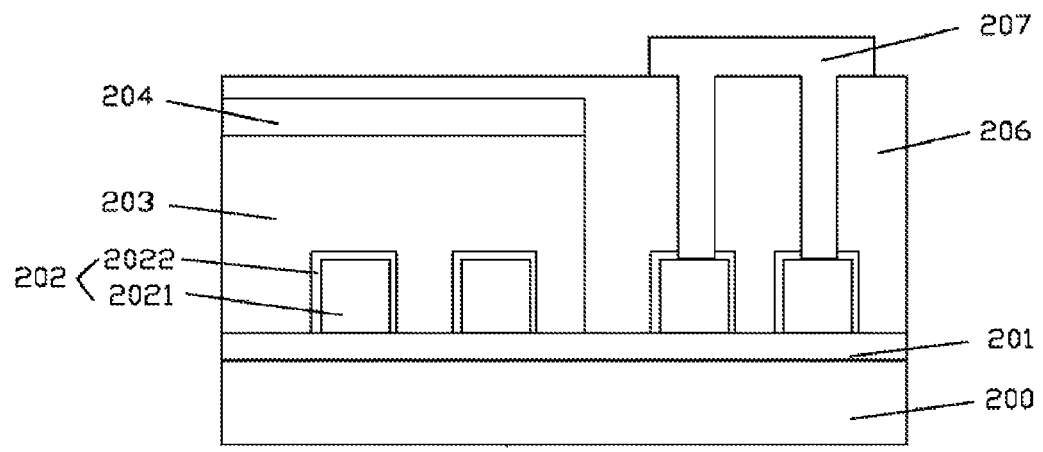

In step 105, as shown in FIG. 4e, forming a metal pad 207 connected with the SiWN within the SiNW device area B. It includes the following steps: applying photolithography and etching technology to form through-holes throughout the oxide film 206 and connected with the top of the polysilicon-wire 2021; depositing metals in the through-holes and on the surface of the oxide film 206 to form a metal layer; applying photolithography and etching technology to the metal layer above the oxide film 206 to form the metal pad 207. The metal pad 207 can be an aluminum pad.

Figure 4F:
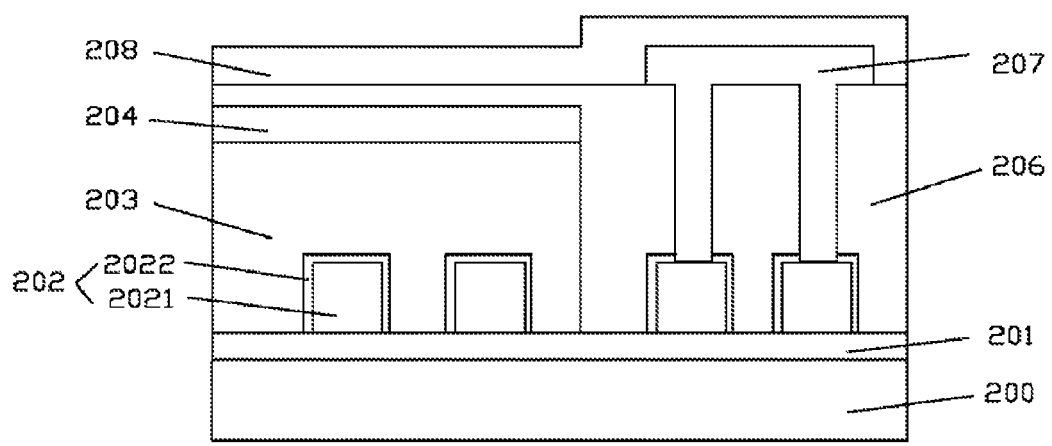
Figure 4G:
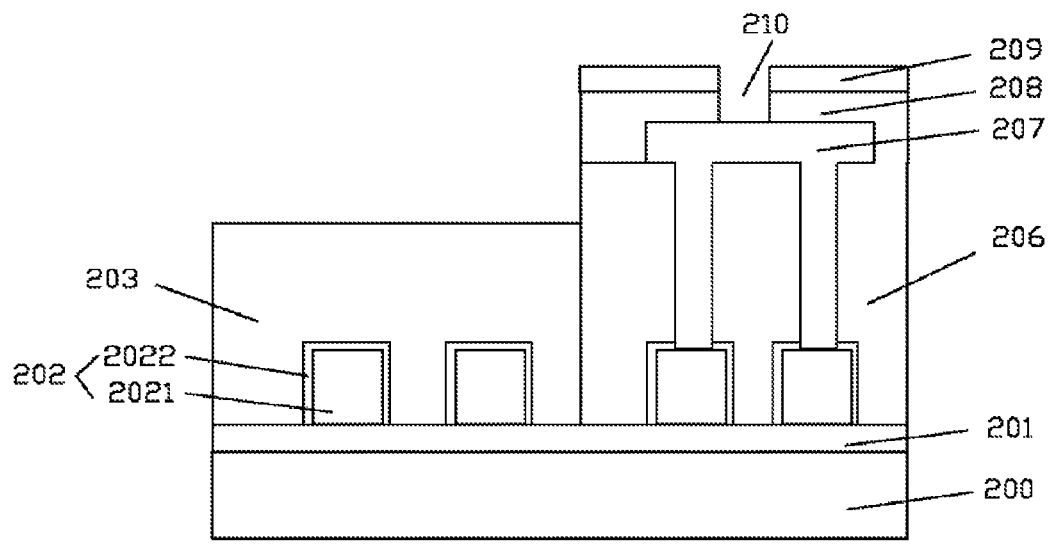

In step 106, as shown in FIG. 4f, depositing a passivation layer 208 on the surface of the above structure formed by step 105. The passivation layer 208 can be made from silicon nitride and silicon dioxide;

In step 107, as shown in FIG. 4g, applying photolithography and etching technology to form contact holes 210 on the metal pad 207 and to remove the passivation layer 208, the oxide film 206 and the DARC 204 above the SiNW outside the device area B, and stopping on the amorphous carbon layer 203. This step further includes: coating photoresist 209 on the passivation layer and forming a first etching window and a second etching window (not shown) through photolithography; etching the passivation layer 208 within the first etching window and stopping on the metal pad 207 to form the contact holes 210; etching the passivation layer 208, the oxide film 206 and the DARC 204 within the second etching window, and stopping on the amorphous carbon layer 203.

Figure 4H:
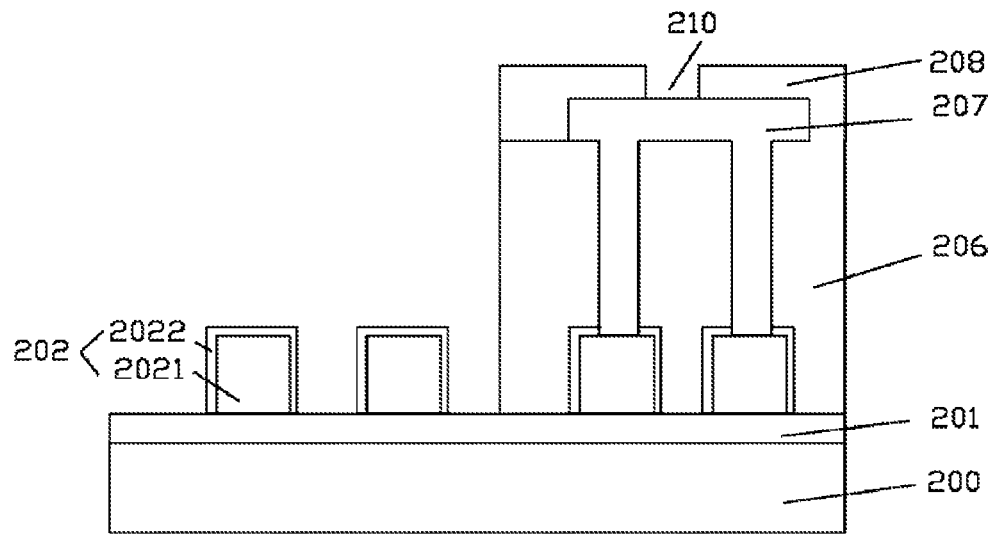

In step 108, as shown in FIG. 4h, removing the amorphous carbon layer 203 above the SiNW 202 outside the SiNW device area B by ashing process to expose the SiNW 202, meanwhile, removing the photoresist 209 above the SiNW device area B. Because the removal of the amorphous carbon layer by ashing process is isotropic, the growing of the mini spacers on the SiNW 202 can be avoided. Compared with other layers such as oxide layer, polysilicon layer or silicon nitride layer, the amorphous carbon layer 203 has higher etching selection ratio. The etching selection ratio of the amorphous carbon layer to the oxide film is 10:1, the etching selection ratio of the amorphous carbon layer to the polysilicon layer is 6:1, the etching selection ratio of the amorphous carbon layer to the silicon nitride layer is 4:1. Since the amorphous carbon layer has both isotropic and anisotropic etching properties, a barrier layer can be formed firstly by anisotropic etching the amorphous carbon layer; after the subsequent low-temperature patterning process such as metal connections, the amorphous carbon layer can be removed by isotropic etching to expose the SiNW. Since the amorphous carbon layer has the significant advantages of high etch ratio and low plasma destructiveness, it is available to avoid the forming of the mini spacer of the SiNW of the SiNW devices and reduce the manufacturing cost as well.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method for producing silicon nanowire devices including the following steps:
    S101: Growing silicon nanowire (SiNW) on a substrate;
    S102: Depositing an amorphous carbon layer to cover the SiNW, followed by depositing a dielectric anti-reflectivity coating on the amorphous carbon layer;
    S103: Removing part of the dielectric anti-reflectivity coating and the amorphous carbon layer above the SiNW through dry etching to expose the SINW device area;
    S104: Depositing an oxide film on the surface of the above structure formed by S103;
    S105: Forming a metal pad connected with the SiNW in the SiNW device area;
    S106: Depositing a passivation layer on the surface of the above structure formed by S105;
    S107: Applying photolithography and etching technology to form contact holes on the metal pad and to remove the passivation layer, the oxide film and the dielectric anti-reflectivity coating above the SiNW outside the SiNW device area, and stopping on the amorphous carbon layer;
    S108: Removing the amorphous carbon layer above the SiNW outside the SiNW device area through ashing process to expose the SiNW.

2. The method for producing silicon nanowire devices according to claim 1, wherein the step of growing SiNW on a substrate comprises:
    Using thermal oxidation technology to form a silicon dioxide layer on the substrate, followed by depositing a polysilicon layer on the silicon dioxide layer and applying low-concentration doping to the polysilicon layer;
    Applying photolithography and etching technology to the polysilicon layer to form polysilicon wires;
    Using thermal oxidation technology to grow an oxide layer on the surface of the polysilicon wires to form the SiNW.

3. The method for producing silicon nanowire devices according to claim 1, wherein the step of removing part of the dielectric anti-reflectivity coating and the amorphous carbon layer above the SiNW through dry etching to expose the SINW device area includes the following detailed steps:
    coating photoresist on the dielectric anti-reflectivity coating and defining the etching window corresponding to the SiNW device area through photolithography;
    removing the dielectric anti-reflectivity coating and the amorphous carbon layer by dry etching through the etching window to expose the SiNW device area; and removing the photoresist.

4. The method for producing silicon nanowire devices according to claim 2, wherein the step of forming the metal pad connected with the SiNW in the SiNW device area includes:
    using photolithography and etching technology to form through-holes throughout the oxide film and connected with the top of the polysilicon wires; depositing metals in the through-holes and on the surface of the oxide film to form a metal layer; and applying photolithography and etching technology to the metal layer on the surface of the oxide film to form the metal pad.

5. The method for producing silicon nanowire devices according to claim 1, wherein the step of applying photolithography and etching technology to form contact holes on the metal pad and to remove the passivation layer, the oxide film and the dielectric anti-reflectivity coating above the SiNW outside the SiNW device area, and stopping on the amorphous carbon layer includes the following steps:
    coating photoresist on the passivation layer and forming a first etching window and a second etching window through photolithography;
    etching the passivation layer within the first etching window and stopping on the metal pad to form the contact holes; etching the passivation layer, the oxide film and the dielectric anti-reflectivity coating within the second etching window, and stopping on the amorphous carbon layer.

6. The method for producing silicon nanowire devices according to claim 5, wherein the step of removing the amorphous carbon layer above the SiNW outside the SiNW device area through ashing process to expose the SiNW includes removing the photoresist in the SiNW device area.

7. The method for producing silicon nanowire devices according to claim 1, wherein the dielectric anti-reflectivity coating has a thickness of 200 Å-600 Å.

8. The method for producing silicon nanowire devices according to claim 1, wherein the metal pad is an aluminum pad.

9. The method for producing silicon nanowire devices according to claim 1, wherein the passivation layer is made from silicon nitride and silicon dioxide.

* * * * *